United States Patent [19]
Ishihara et al.

[11] Patent Number: 4,767,004
[45] Date of Patent: Aug. 30, 1988

[54] METHOD OF PACKING ELECTRONIC PARTS AND A PACK PRODUCED BY THE METHOD

[75] Inventors: Michio Ishihara, Yokohama; Hiroshi Oishi, Aizuwakamatsu; Makoto Kuboyama, Yokohama, all of Japan

[73] Assignee: Fujitsu Limited, Kawasaki, Japan

[21] Appl. No.: 139,167

[22] Filed: Dec. 21, 1987

Related U.S. Application Data

[63] Continuation of Ser. No. 915,880, Oct. 8, 1986, which is a continuation of Ser. No. 731,611, May 7, 1985, which is a continuation of Ser. No. 525,800, Aug. 24, 1983, abandoned, which is a continuation of Ser. No. 253,000, Apr. 10, 1981, abandoned.

[30] Foreign Application Priority Data

Apr. 10, 1980 [JP] Japan ................... 55-47069

[51] Int. Cl.⁴ .......................................... B65D 73/02
[52] U.S. Cl. .................... 206/334; 206/497; 206/471; 206/524.8
[58] Field of Search ............. 206/334, 328, 497, 471, 206/524.8

[56] References Cited

U.S. PATENT DOCUMENTS

| | | |
|---|---|---|
| 3,700,100 | 10/1972 | Bohannon, Jr. |
| 3,747,749 | 7/1973 | Brown ................... 206/497 |
| 3,849,873 | 11/1974 | Coffin . |
| 3,944,070 | 3/1976 | Cardwell et al. ......... 206/497 |
| 4,213,529 | 7/1980 | Whitaker ............... 206/497 |

FOREIGN PATENT DOCUMENTS

| | | |
|---|---|---|
| 2052595 | 5/1972 | Fed. Rep. of Germany ...... 206/497 |
| 2844169 | 4/1980 | Fed. Rep. of Germany . |
| 2949196 | 7/1980 | Fed. Rep. of Germany . |
| 52-2284 | 4/1977 | Japan . |
| 53-134362 | 2/1978 | Japan . |
| 1188375 | 4/1970 | United Kingdom . |
| 1569881 | 6/1980 | United Kingdom . |

*Primary Examiner*—Joseph Man-Fu Moy
*Attorney, Agent, or Firm*—Staas & Halsey

[57] ABSTRACT

In this method of packing electronic parts electronic parts are inserted into a plurality of containers each of which has an opening on the upper surface thereof. These containers are juxtaposed side by side. A single common pressing plate is disposed over the containers so as to cover their openings. The containers and pressing plate are packed together in a sack under vacuum.

21 Claims, 5 Drawing Sheets

METHOD OF PACKING ELECTRONIC PARTS AND A PACK PRODUCED BY THE METHOD

This is a continuation of application Ser. No. 915,880, filed 10-8-86, which is a continuation of Ser. No. 731,611, filed 5-7-85, which is a continuation of Ser. No. 525,800, filed 8-24-83, now abandoned, which is a continuation of application Ser. No. 253,000, filed 4-10-81, now abandoned.

TECHNICAL FIELD

The present invention relates to the art of packing electronic parts, especially it relates to a vacuum pack of electronic parts and a method of packing electronic parts so as to obtain a convenient pack of electronic parts.

BACKGROUND OF THE INVENTION

An electronic part, such as a semiconductor·integrated circuit device or a transistor, comprises a semiconductor chip housed in a housing body. Electronic parts are housed in a stick like container and conveyed from an assembling process station to a test process station or from the test process station to a mounting process station in which electronic parts are mounted onto a printed board.

In the packing method of the prior art, the pack does not firmly hold the electronic parts in the container. Also, according to the prior art, it is not convenient to handle the container at the time of packing the containers under vacuum. The present invention was made considering the above points.

BRIEF DESCRIPTION OF THE DRAWINGS

The present invention will be described with reference to the accompanying drawings.

FIG. 3 is a sectional view of a plurality of containers packed under vacuum according to one example of.

SUMMARY OF THE INVENTION

The present invention will be described in comparison with the prior art.

Figure 1:
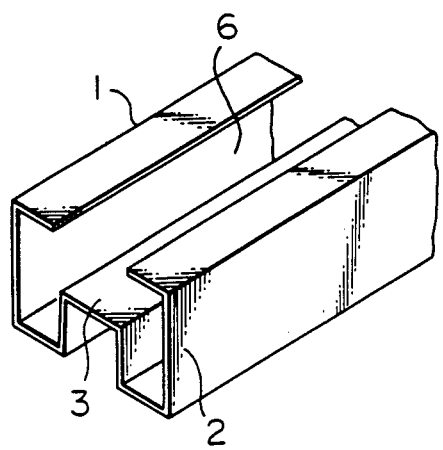
FIG. 1 is a persective view of an end of an example of a prior art electronic parts container of a type used in the present invention.
Figure 2:
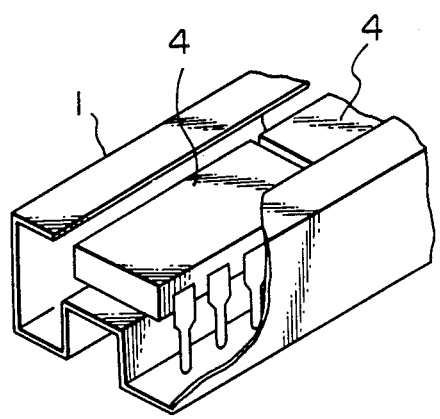
FIG. 2 is a partially torn off perspective view of said container of FIG. 1 which houses electronic parts therein.

An electronic parts container 1 (FIG. 1) comprises a hollow housing body 2 which has a longitudinal opening 6 on the top portion thereof and a support 3 projecting from the bottom of the housing body 2. The container 1 has a substantially rectangular sectional shape and is usually long enough to be called a stick. The support 3 is formed longitudinally along this stick-like container so as to serve as a guide rail which supports electronic parts to be housed. This container is made of either metal such as aluminum or copper or synthetic resin. Plural electronic parts 4 such as IC devices, are housed in a row within the container 1 as illustrated in FIG. 2.

Figure 3:
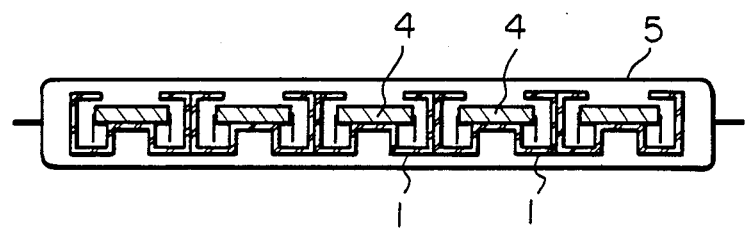

The container 1 containing the electronic parts 4 is to be conveyed, several stick like containers 1 were juxtaposed side by side and packed together under vacuum in a transparent synthetic resin film sack 5 as illustrated in FIG. 3. The sack 5 contacts closely the outer surfaces of the containers 1 and the electronic parts 4 under the action of the vacuum, although the sack is illustrated as being apart from the outer surfaces of the packed articles for easy understanding of the drawing. Such a pack employing electronic parts container 1 packed within the sack 5 under vacuum prevents the contamination of the electronic parts 4.

Figure 4:
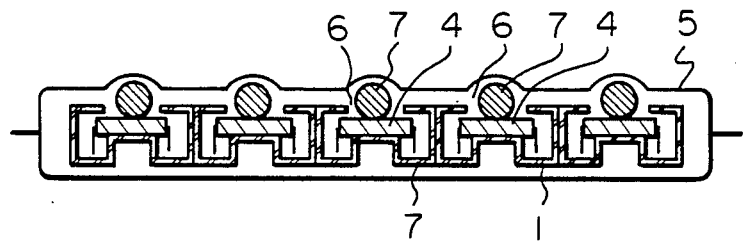
FIG. 4 is a sectional view of a plurality of containers packed under vacuum according to another.

However, such a pack does not firmly hold the electronic parts 4 on the support 3 of the container 1. Therefore, it is necessary to firmly hold the electronic parts 4 within the container 1 so as to avoid damage to the electronic parts 4 due to vibration or displacement of the electronic parts 4 during conveyance. For this purpose, a cylindrical bar 7 is placed on the electronic parts 4 within each container 1 through the opening 6 of the container as illustrated in FIG. 4. The bar 7 presses the electronic parts 4 downward when the vacuum process is completed in the sack 5.

However, in the above method and pack construction according to the, it was not convenient to handle the container at the time of packing the containers under vacuum because a long cylindrical bar 7 was simply placed on each container 1. Since the electronic parts placed in a row within each stick like container have a disparity in their thicknesses, the bar can not firmly press a thin electronic part placed adjacent to a thick electronic part. Besides, identifying marks on the electronic parts are hidden by the bar. Therefore, it is not easy to distinguish the articles in the vacuum pack.

The present invention was made considering the above defective points of the prior art. An object of the present invention is to provide an electronic parts packing method in which containers can be conveniently treated during the packing operation, and identifying marks of the electronic parts within each container can be read.

A method of packing electronic parts according to the present invention comprises: electronic parts inserted into a plurality of containers each of which has an opening on the top thereof; said containers are juxtaposed side by side; a single common pressing plate is disposed over said containers so as to cover their openings; and, said containers and said pressing plate are packed together in a sack under vacuum.

Embodiments of the present invention will now be described hereinafter.

DESCRIPTION OF PREFERRED EMBODIMENTS

Figure 5:
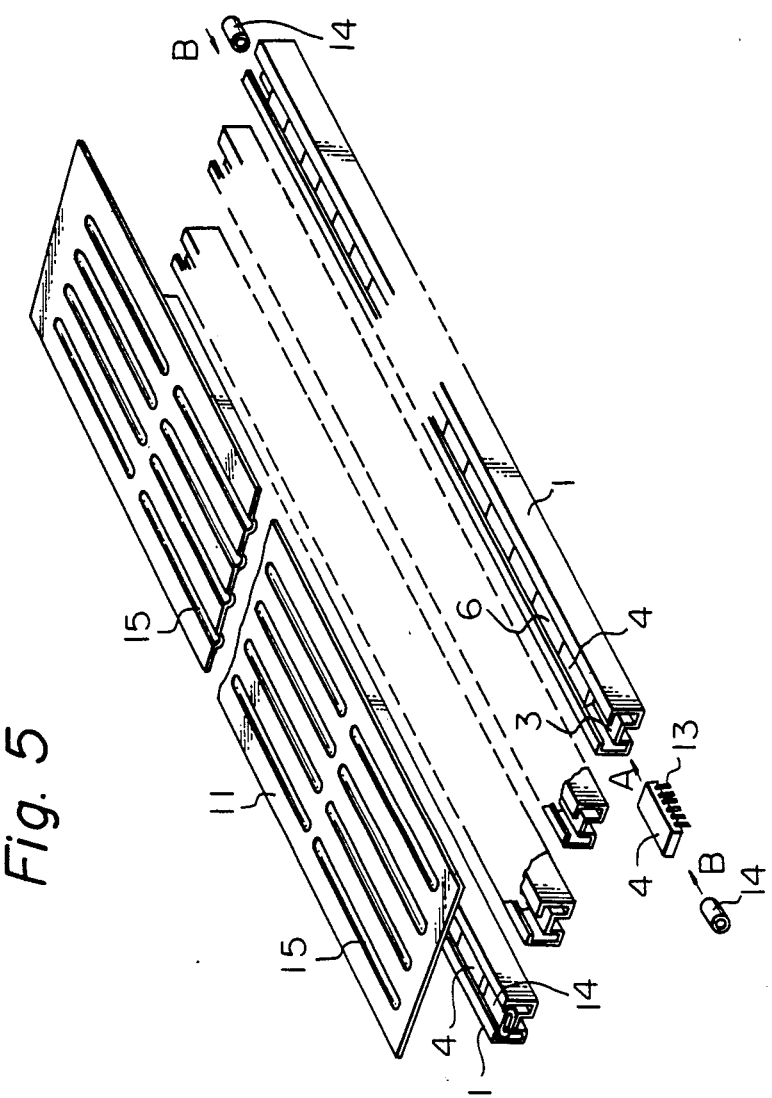
FIG. 5 is a perspective view of a pressing plate and containers before assembling according to the present invention.

As illustrated in FIG. 5, electronic parts 4, such as IC devices or transistors, having lead terminals 13 are inserted into each of four stick like containers 1 as shown by the arrow A along the projected support 3 for guiding the electronic parts 4. The container 1 has a substantially rectangular sectional shape and is made of conductive metal or synthetic resin or plastic material with an inner coating of conductive material so as to even the level of static electricity of individual electronic parts. Thereby, it is possible to avoid the adverse effects of the static electricity on the inner circuit of each electronic part. The container 1 has an opening 6 along the longitudinal direction on its top portion. A prescribed number of electronic parts are inserted in a row into each of the containers 1. After that, a plug 14 is installed in each end of the container 1. The plug 14 is formed by an easily deformable elastic sleeve. The plug 14 is preferably made of desulfurized rubber so as not to erode the electronic parts. The plug 14 may be formed by an easily deformable elastic ball instead of the elastic sleeve. Four containers 1 each of which houses electronic parts are disposed side by side in a manner that side surfaces of adjacent containers contact each other though the containers are illustrated as being apart from each other for easy understanding of the drawing. A pressing plate 15 is disposed over the four containers 1. This pressing plate 15 is made of transparent synthetic resin and has four parallel rows of projections which project downward. The distance between the rows corresponds to the distance between the openings 6 of the adjacent two containers 1. Each of the projections 15 is disposed on the row of electronic parts 4 within each container 1 through its opening 6. In such a manner, a single common pressing plate 11 is placed over the juxtaposed containers 1. After that, the pressing plate 11 and the containers 1 are packed within a transparent synthetic resin film sack (not shown in FIG. 5) under vacuum so as to form a vacuum pack of containers. In this vacuum pack, the projections 15 press the electronic parts 4 against the support 3 of the container 1 under action of the vacuum. The length L of the pressing plate 11 is substantially equal to the length of the container 1. The width W of the pressing plate 11 is substantially equal to the sum of the widths of four containers 1. It is desirable that the thickness of the pressing plate 11 is about 0.2-0.5 mm and the packing process is conducted under a vacuum of about 150-200 mmHg in case that the container is made of synthetic resin. Higher vacuum can be used in case that the container is made of metal. In such a condition, the pressing plate has adequate flexibility so that all of the electronic parts can be firmly pressed and held stationary even though the thickness of the electronic parts varies.

Figure 6:
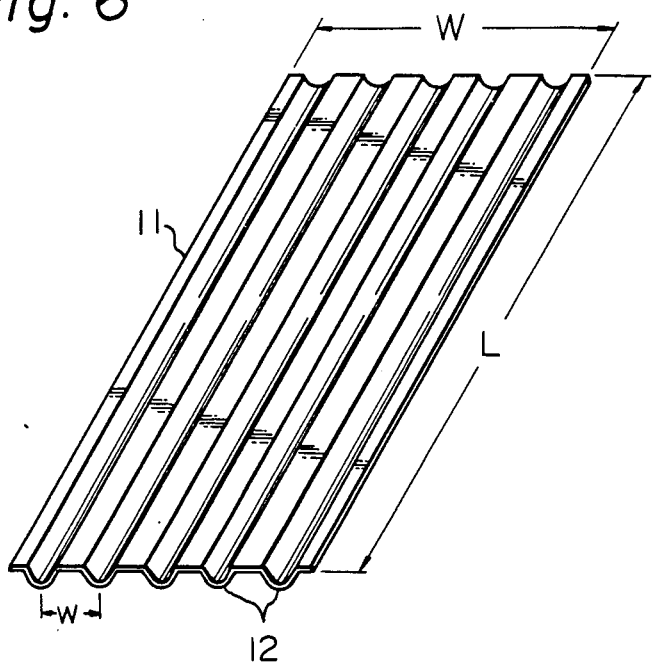
FIG. 6 is a perspective view of a pressing plate accoording to the present invention.
Figure 7:
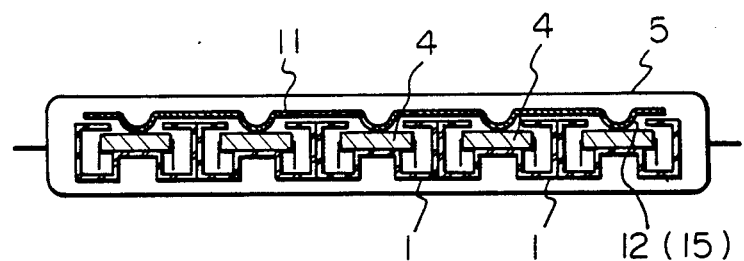
FIG. 7 is a sectional view of a plurality of containers packed under vacuum using the pressing plate according to the present invention.

Another exmaple of the pressing plate according to the present invention is illustrated in FIG. 6. This pressing plate 11 is made of, for example, transparent synthetic resin. The pressing plate has a plurality of rows of corrugated like projection 12. These rows of projections 12 are parallel to each other at prescribed intervals. The length L of this pressing plate 11 is substantially equal to the length of the electronic parts container 1. The width W of the pressing plate 11 depends upon the number of disposed containers.

This pressing plate 11 is placed over the plural containers juxtaposed side by side so as to commonly cover all the openings of the containers. The number of containers is five in this example. The pressing plate 11 and the containers 1 are enclosed within a transparent synthetic resin film sack 5 and packed under vacuum. In this situation, the projections 12 press the electronic parts 1 housed within the container 1. The distance W between the two adjacent projections is equal to the distance between the centers of adjacent two containers 1. Such a distance is equal to the width of the container 1 in case that all of the containers are of the same size.

Figure 8:
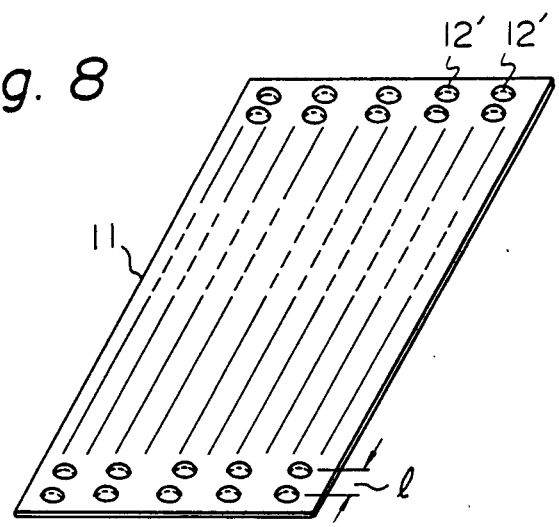
FIG. 8 is a perspective view of another example of the pressing plate according to the present invention.
Figure 9:
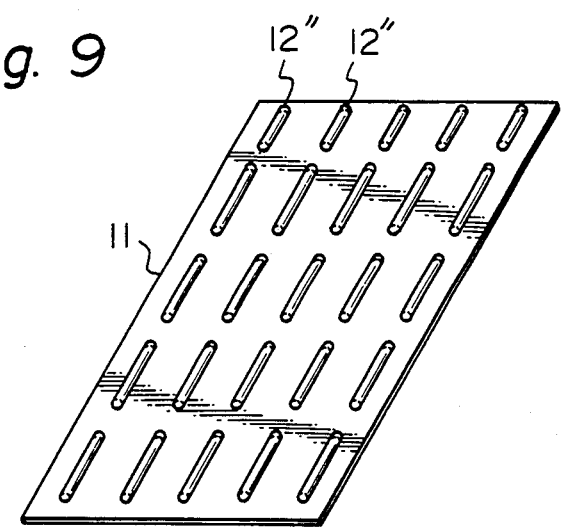
FIG. 9 is a perspective view of a further example of the pressing plate according to the present invention.

Further examples of the pressing plate used in the packing method according to the present invention are illustrated in FIGS. 8 and 9.

A pressing plate 11 illustrated in FIG. 8 has projections 12' each of which is of semi-spherical shape. The distance l between two adjacent semi-spherical projections 12' in a row in the longitudinal direction of the plate is either equal to the length of one electronic part or shorter than the length of one electronic part.

A pressing plate 11 illustrated in FIG. 9 has projections 12" each of which has a length corresponding to the length of one electronic part. The distance between the adjacent two projections 12' is determined on the basis of the size and number of the electronic parts housed within the container.

As mentioned above, in the packing method according to the present invention, a pressing plate 11 is used so as to commonly press electronic parts housed within plural stick like containers instead of disposing a separate pressing bar in every container as is the case in the prior art. At the time of the packing process under vacuum, the bundling operation of separated stick like containers is conveniently conducted by using one single common pressing plate. Therefore, the present invention is especially advantageous when it is applied in a vacuum packing process of electronic parts containers.

The pressing plate does not warp unrestorably, i.e. it retains flexibility, while the pressing bar of the inventor's earlier proposal warps so that the electronic parts drop out of the container. The warp is assuredly avoided especially by using the pressing plate illustrated in FIGS. 5, 8 or 9 in which plural projections form a row of projections so that a plane plate portion is formed between every two adjacent projections.

The marks of the electronic parts can be easily read because the pressing plate is made of a transparent synthetic resin. Therefore, it is easy to confirm the electronic parts within the container.

In the above mentioned examples, four or five containers for electronic parts are packed together. However, the number of containers are not limited to four or five. Any convenient number of containers can be packed together by using a pressing plate whose size is determined by the size and the number of containers.

The pressing plate may be formed by an opaque material if it is not necessary to read marks on the electronic parts.

In the above mentioned examples, each of the electronic parts has lead terminals on the two longitudinal side surfaces of the box shaped body. However, this invention can be applied to an electronic part which has lead terminals on all of four side surfaces of a box shaped body. In this case, the electronic parts container comprises a number of projected supports for the electronic parts on the bottom thereof. The shape and the number of the supports correspond to the shape and the number of the electronic parts to be housed.

This invention can also be applied to an electric part called a chip carrier which has no lead terminals on its side surfaces.

We claim:

1. A method capable of packing under vacuum electronic parts having variations in thickness, the method comprising the steps of:

inserting said electronic parts into a hollow elongated electronic parts container, said hollow electronic parts container having an opening on the upper surface thereof and an inner space where said electronic parts are housed in a row along the longitudinal direction of the container, said opening being formed along the longitudinal direction of the container, and said inner space having a size allowing said electronic parts within the container to freely move along the longitudinal direction of the container;

juxtaposing a plurality of said electronic parts containers side by side;

disposing a single common pressing plate of flexible material over said plurality of electronic parts containers so as to cover said openings on said upper surfaces and for pressing against the electronic parts in the containers, whrein said pressing plate has integrally formed projections thereon with the same number of rows of projections as said plurality of electronic parts containers, each of said projection rows having a plurality of said projections and facing one of said openings of each of said containers, each of said projections being elongated in the longitudinal direction of each of said containers, and wherein the width of said pressing plate is less than that of each of said containers; and packing said electronic parts containers and said pressing plate together in a sack under vacuum, wherein each of said electronic parts housed in said containers is pressed by at least one of said projections under the action of vacuum and wherein said pressing plate comprises flat portions between said projections in each projection row and between said projection rows so that the pressing plate can freely deform under vacuum action so that all of said electronic parts can be firmly pressed and held stationary even with variations in thickness of said electronic parts.

2. A method of packing electronic parts under vacuum according to claim 1, wherein said pressing plate is made of a flexible synthetic resin.

3. A method of packing electronic parts under vacuum according to claim 2, wherein said synthetic resin is transparent.

4. A method of packing electronic parts under vacuum according to claim 1, wherein said pressing plate has the shape of a corrugated sheet which has rows of continuous projections along the longitudinal direction of said container.

5. A method of packing electronic parts under vacuum according to claim 1, wherein each of said projections of said pressing plate has a semi-spherical shape.

6. A method of packing electronic parts under vacuum according to claim 1, wherein said pressing plate has rows of longitudinal projections disposed in series.

7. A method of packing electronic parts under vacuum according to claim 1, wherein each of said electronic parts has a box shaped body with lead terminals disposed on two opposite side surfaces of said box shaped body.

8. A method of packing electronic parts under vacuum according to claim 1, wherein each of said electronic parts has a box shaped body with lead terminals disposed on all of four side surfaces of said box shaped body.

9. A method of packing electronic parts under vacuum according to claim 1, wherein each of said electronic parts has a box shaped body with no lead terminals on each of its side surfaces.

10. A method of packing electronic parts under vacuum according to claim 1, wherein said hollow container is made of conductive metal.

11. A method of packing electronic parts under vacuum according to claim 1, wherein said hollow container is made of nonmetallic material with an inner coating of conductive material.

12. A method of packing electronic parts under vacuum according to claim 1, further comprising the step of installing a deformable plug into each end of said hollow container.

13. A method of packing electronic parts under vacuum according to claim 12, wherein said deformable plug is made of desulphurized rubber.

14. A method of packing electronic parts under vacuum according to claim 1, wherein the thickness of said pressing plate is from 0.2 to 0.5 millimeters.

15. A method of packing electronic parts under vacuum according to claim 1, wherein said vacuum is from 150 to 200 mmHg.

16. A method of packing electronic parts under vacuum according to claim 1, wherein each of said projections of said pressing plate is equal in length to one of said electronic parts.

17. A method of packing electronic parts under vacuum according to claim 1, wherein each of said projections of said pressing plate is less than the length of one of said electronic parts.

18. A method of packing electronic parts under vacuum according to claim 1, wherein the longitudinal distance between each of said projections of said pressing plate is equal to the length of one of said electronic parts.

19. A method of packing electronic parts under vacuum according to claim 1, wherein the longitudinal distance between each of said projections of said pressing plate is less than the length of one of said electronic parts.

20. A method of packing electronic parts under vacuum according to claim 1, wherein said pressing plate does not warp unrestorably.

21. A pack of electronic parts containers packed under vacuum comprising:

hollow containers having a substantially rectangular sectional shape and juxtaposed side by side, each of said containers having an opening on the upper surface thereof along the longitudinal direction thereof and a longitudinal support projection from the bottom of said container toward the inside thereof;

electronic parts disposed on said support in series;

a single pressing plate disposed over said containers, said plate having projections for pressing said electronic parts through said opening of said container, wherein said pressing plate has the same number of rows of projections as that of said containers, each of said projection rows including a plurality of said projections and facing one of said openings of each of said containers, each of said projections being elongated in the longitudinal direction of each of said containers, and wherein the width of said pressing plate is less than the total width of said plurality of containers and the length of said pressing plate is less than that of each of said containers; and a sack for a vacuum pack including said containers, said electronic parts and said pressing plate, wherein each of said electronic parts housed in said containers is pressed by at least one of said projections under vacuum action and wherein said pressing plate comprises flat portions between said projections in each projection row and between said projection rows so that the pressing plate can freely deform under vacuum action so that all of said electronic parts can be firmly pressed and held stationary even with variations in thickness of said electronic parts.

* * * * *